(12) United States Patent
Felsl et al.

(10) Patent No.: US 9,105,682 B2
(45) Date of Patent: Aug. 11, 2015

(54) SEMICONDUCTOR COMPONENT WITH IMPROVED DYNAMIC BEHAVIOR

(75) Inventors: Hans-Peter Felsl, Munich (DE); Thomas Raker, Unterfoehring (DE); Hans-Joachim Schulze, Taufkirchen (DE); Franz-Josef Niedernostheide, Muenster (DE)

(73) Assignee: Infineon Technologies Austria AG, Villach (AU)

( * ) Notice: Subject to any disclaimer, the term of this patent is extended or adjusted under 35 U.S.C. 154(b) by 451 days.

(21) Appl. No.: 13/036,088

(22) Filed: Feb. 28, 2011

(65) Prior Publication Data

US 2012/0217539 A1 Aug. 30, 2012

(51) Int. Cl.
| | |
|---|---|
| *H01L 29/739* | (2006.01) |
| *H01L 29/744* | (2006.01) |
| *H01L 29/06* | (2006.01) |
| *H01L 29/10* | (2006.01) |
| *H01L 29/861* | (2006.01) |
| *H01L 29/87* | (2006.01) |

(52) U.S. Cl.
CPC .......... *H01L 29/744* (2013.01); *H01L 29/0607* (2013.01); *H01L 29/1016* (2013.01); *H01L 29/8611* (2013.01); *H01L 29/87* (2013.01)

(58) Field of Classification Search
USPC .................. 257/173, 579, 109, 565
IPC ......................................... H01L 29/87
See application file for complete search history.

(56) References Cited

U.S. PATENT DOCUMENTS

| | | | | |
|---|---|---|---|---|
| 4,819,052 A | * | 4/1989 | Hutter ............................ | 257/378 |
| 4,969,027 A | * | 11/1990 | Baliga et al. ................... | 257/130 |
| 5,380,670 A | * | 1/1995 | Hagino .......................... | 438/138 |
| 5,479,031 A | * | 12/1995 | Webb et al. .................... | 257/173 |
| 5,629,543 A | * | 5/1997 | Hshieh et al. .................. | 257/330 |
| 5,874,751 A | * | 2/1999 | Iwamuro et al. ............... | 257/140 |
| 5,981,984 A | * | 11/1999 | Iwaana et al. .................. | 257/138 |
| 6,441,437 B1 | * | 8/2002 | Gossner ......................... | 257/355 |
| 6,448,589 B1 | * | 9/2002 | Casey et al. .................... | 257/173 |
| 6,472,710 B2 | * | 10/2002 | Terashima ..................... | 257/343 |
| 6,603,155 B2 | * | 8/2003 | Duane et al. ................... | 257/173 |
| 7,301,220 B2 | * | 11/2007 | Udrea ............................ | 257/556 |
| 7,535,040 B2 | * | 5/2009 | Yoshinobu ..................... | 257/273 |
| 7,560,355 B2 | * | 7/2009 | Kao et al. ....................... | 438/328 |
| 7,728,404 B2 | * | 6/2010 | Van Dalen et al. ............ | 257/497 |
| 7,863,170 B2 | * | 1/2011 | Rohrer et al. .................. | 438/526 |
| 7,943,959 B2 | * | 5/2011 | Rodrigues ..................... | 257/173 |
| 7,994,569 B2 | * | 8/2011 | Udrea et al. ................... | 257/329 |
| 8,071,450 B2 | * | 12/2011 | Chen ............................. | 438/269 |

FOREIGN PATENT DOCUMENTS

| | | |
|---|---|---|
| DE | 69635824 T2 | 10/2006 |
| DE | 102006024504 A1 | 11/2007 |
| DE | 102008042170 A1 | 4/2009 |

\* cited by examiner

*Primary Examiner* — Eugene Lee
(74) *Attorney, Agent, or Firm* — Murphy, Bilak & Homiller, PLLC

(57) ABSTRACT

Disclosed is a semiconductor component that includes a semiconductor body, a first emitter region of a first conductivity type in the semiconductor body, a second emitter region of a second conductivity type spaced apart from the first emitter region in a vertical direction of the semiconductor body, a base region of one conductivity type arranged between the first emitter region and the second emitter region, and at least two higher doped regions of the same conductivity type as the base region and arranged in the base region. The at least two higher doped regions are spaced apart from one another in a lateral direction of the semiconductor body and separated from one another only by sections of the base region.

25 Claims, 4 Drawing Sheets

SEMICONDUCTOR COMPONENT WITH IMPROVED DYNAMIC BEHAVIOR

TECHNICAL FIELD

Embodiments of the present application relate to a semiconductor component, in particular a bipolar power semiconductor component.

BACKGROUND

Bipolar power semiconductor components, like power diodes, power IGBTs (insulated gate bipolar transistors), or power thyristors, include a first emitter region of a first conductivity type, a second emitter region of a second conductivity type, and a base or drift region arranged between the first and second emitter regions. The base region is of one of the first and second conductivity types and has a lower doping concentration than the first and second emitter regions. When the component is in its conducting or on-state, charge carriers of the first conductivity type are injected into the base region from the first emitter region, and charge carriers of the second conductivity type are injected into the base region from the second emitter region. These charge carriers form a charge carrier plasma in the base region. This plasma with charge carriers of the first and second conductivity type results in a low resistance of the component in the on-state.

When the component is switched off, i.e. when the component transits from its on-state into its off or non-conducting state these charge carriers that form the charge carrier plasma have to be removed from the base region. In this case, charge carriers of the first conductivity type flow in the direction of the first emitter region, and charge carriers of the second conductivity type flow in the direction of the second emitter region. When the component switches into its off-state, a space charge region starts to propagate in the base region. The generation of this space charge region together with the mobile charges that are extracted out of the plasma region may result in locally increased electric field strength. Dynamic avalanche occurs when the field strength reaches a critical value ($E_{CRIT}$). Due to this avalanche generation and a positive feedback for carrier generation the current flow may become inhomogeneous.

This current crowding results in a high current density in regions where the electric field strength is locally increased. Since the formation of current filaments usually occurs in a relatively small area, the current flow is also limited to this small area. A high current flow in a small area of the base region may result in a strong heating of those regions in which the breakdown occurs. This may result in a damage or a degradation of the semiconductor component.

There is, therefore, a need to provide a semiconductor component which has an improved dynamic behavior, i.e. an improved behavior when switching from the on-state to the off-state.

SUMMARY

An embodiment relates to a semiconductor component with a semiconductor body, a first emitter region of a first conductivity type in the semiconductor body, and a second emitter region of a second conductivity type spaced apart from the first emitter region in a vertical direction of the semiconductor body. Further, a base region of one conductivity type is arranged between the first emitter region and the second emitter region, and at least two higher doped regions of the same conductivity type as the base region and arranged in the base region. The higher doped regions are spaced apart one another in a lateral direction of the semiconductor body and separated from one another only by sections of the base region.

BRIEF DESCRIPTION OF THE DRAWINGS

Examples will now be explained with reference to the drawings. The drawings serve to illustrate the basic principle, so that only aspects necessary for understanding the basic principle are illustrated. The drawings are not to scale. In the drawings the same reference characters denote like features.

DETAILED DESCRIPTION

Figure 1:
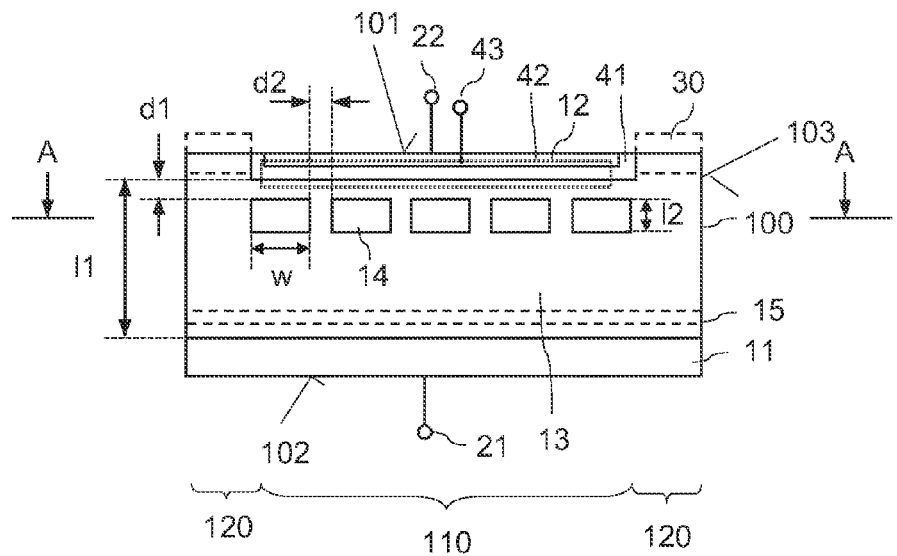
FIG. 1 shows a schematic vertical cross sectional view of a first embodiment of a bipolar semiconductor component implemented as an IGBT.

FIG. 1 schematically illustrates a vertical cross sectional view of a semiconductor component, in particular a bipolar power semiconductor component. The semiconductor component includes a semiconductor body 100 having a first surface 101 and a second surface 102 opposite the first surface 101. The semiconductor body 100 can include a conventional semiconductor material, like silicon (Si), etc. FIG. 1 illustrates a vertical cross section through the semiconductor body 100, which is a cross section in a vertical section plane extending perpendicular to the first and second surfaces 101, 102.

The semiconductor body 100 includes an inner region 110 and an edge region 120. The edge region 120 is arranged between the inner region 110 and an edge surface or edge surfaces 103 of the semiconductor body 100. The edge surface(s) 103 extend(s) between the first surface 101 and the second surface 102. The semiconductor body 100 terminates at the edge surface 103 in a lateral or horizontal direction of the semiconductor body 100.

Figure 3:
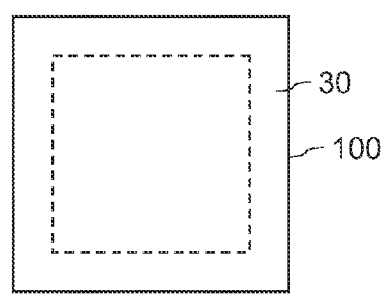
FIG. 3 illustrates a plan view of a semiconductor component with a rectangular semiconductor body according to an embodiment.
Figure 4:
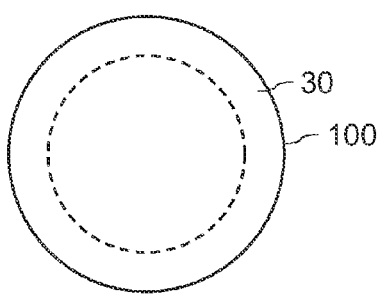
FIG. 4 illustrates a plan view of a semiconductor component with a circular semiconductor body according to an embodiment.

Referring to FIGS. 3 and 4 which schematically illustrate plan views of the semiconductor body 100, the semiconductor body 100 may have a rectangular geometry (FIG. 3) or a circular geometry (FIG. 4). As can be seen from FIGS. 3 and 4 the edge region 120 encloses the inner region 110 of the semiconductor body 100.

Referring again to FIG. 1, the edge surface 103 may extend perpendicular relative to the first and second surfaces 101, 102. However, this is only an example. The edge surface 103 could also be bevelled relative to the first and second surface 101, 102 (with a positive bevel or with a negative bevel). The semiconductor component may include edge terminations 30, which are only schematically illustrated in dashed lines in FIG. 1. Such edge terminations may, for example, include field plates, channel stoppers, field rings, etc. Edge terminations and bevelled or not bevelled edge surface are commonly known, so that no further explanations are necessary in this regard.

The semiconductor component of FIG. 1 is implemented as an IGBT according to this embodiment and includes a first emitter region 11 of a first conductivity type, a second emitter region 12 of a second conductivity type complementary to the first conductivity type, and a base or drift region 13 of one of the first and second conductivity types arranged between the first emitter region 11 and the second emitter region 12. The first emitter region 11 and the second emitter region 12 are spaced apart from one another in a vertical direction of the semiconductor body 100. In the embodiment illustrated in FIG. 1, the first emitter region 11 adjoins the second surface 102 of the semiconductor body 100, and the second emitter region 12 adjoins the first surface 101 of the semiconductor body 100.

A doping concentration of the base region 13 is lower than a doping concentration of the first and second emitter regions 11, 12. The doping concentration of the base region 13 is, for example, in the range of between $10^{12}$ cm$^{-3}$ and $10^{15}$ cm$^{-3}$ and the doping concentrations of the first and second emitter regions 11, 12 are, for example, in the range of between $10^{16}$ cm$^{-3}$ and $10^{21}$ cm$^{-3}$. For explanation purposes only it is assumed that the base region 13 is doped with dopants of the second conductivity type, which is the conductivity type of the dopants of the second emitter region 12.

Optionally, a field stop region 15 of the same conductivity type as the base region 13 is arranged in the base region 13. This field stop region 15 has a higher doping concentration than the base region 13 but a lower doping concentration than the first emitter region 11. The field stop region 15 may be arranged adjacent the first emitter region 11, or may be spaced apart from the first emitter region 11, but closer to the first emitter region 11 than to the second emitter region 12.

The base region 13 is arranged in the inner region 110 and in the edge region 120. According to one embodiment, the base region 13 has a homogenous doping concentration. According to a further embodiment, the base region 13 has a lower doping concentration in the edge region 120 than in the inner region 110. In the embodiment illustrated in FIG. 1, the first emitter region 11 and the optional field stop region 15 are arranged in the inner region 110 and in the edge region 120. In this case, the emitter region 11 and the field stop region 15 extend to the edge surface 103 in the lateral direction. However, this is only an example. According to a further embodiment, at least one of the first emitter region 11 and the field stop region 15 is only arranged in the inner region 110. The second emitter region 12 is only arranged in the inner region 110 of the semiconductor body 100 according to this embodiment.

For explanation purposes only it is assumed that the first emitter region 11 is p-doped, so that the first conductivity type is p-type, and that the second emitter region 12 is n-doped, so that the second conductivity type is n-type. Further, it is assumed that the base region 13 is n-doped.

The second emitter region 12 is separated from the base region 13 by a body region 41 which is doped complementarily to the second emitter region 12 and the base region 13. Further a control structure or gate structure 42 which is connected to a gate terminal 43 is arranged in the body region 41 and serves to control a conducting channel between the second emitter region 12 and the base region 13 through the body region 41. This gate or control structure 42 is schematically illustrated in dotted lines in FIG. 1. The maximum doping concentration of the body region 41 is, for example, in the range of between $10^{17}$ cm$^{-3}$ and $10^{19}$ cm$^{-3}$.

Figure 2:
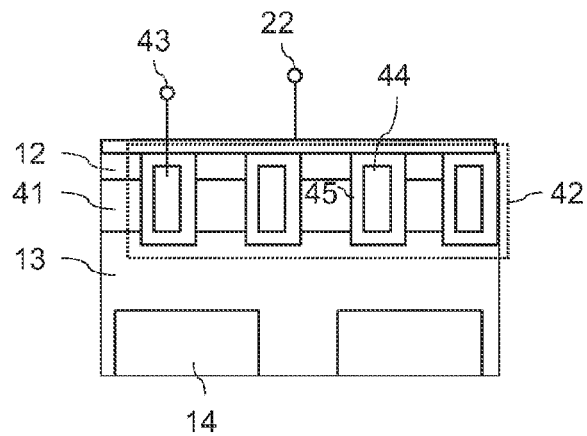
FIG. 2 illustrates a detailed view of a control structure of the IGBT of FIG. 1.

FIG. 2 illustrates a vertical cross sectional view through a part of the second emitter region 12, the body region 41 and the base region 13 in order to illustrate one embodiment of the gate structure 42. In this embodiment the gate structure 42 includes a gate electrode 44 implemented in a trench or in trenches extending from the second emitter region 12 through the body region 41 into the base region 13. The gate electrode 44 is dielectrically insulated from the body region 41 and the other semiconductor regions 12, 13 by a gate dielectric 45 and is electrically connected to a gate terminal 43. The trenches with the gate electrode 44 separate the second emitter region 12—which in an IGBT is also referred to as a source region—into several sections. In an IGBT, the base region 13 is also referred to as a drift region, and the first emitter region 11 is also referred to as a drain region.

The IGBT of FIG. 1 is conducting when a positive voltage is applied between a first terminal 21 electrically connected to the first emitter region 11 and a second terminal 22 electrically connected the second emitter region(s) 12, and when an electrical potential is applied to the gate terminal 43 which is suitable to effect a conducting (inversion) channel in the body region 41 between the second emitter region 12 and the base region 13. The first and second terminals 21, 22 are only schematically illustrated in FIG. 1. These terminals may, for example, be implemented as metallization layers (not shown) arranged on the first and second emitter regions 11, 12.

When the IGBT is conducting, p-type charge carriers (holes) are injected into the base region 13 from the first emitter region 11 and n-type charge carriers (electrons) are injected into the base region 13 from the second emitter region 12, through the channel in the body region 41. These holes and electrons form a charge carrier plasma in the base region 13. This plasma results in a low on-resistance of the IGBT. The IGBT is blocking when the conducting channel in the body region 41 is interrupted by applying a suitable gate potential. In an IGBT having an n-doped second emitter region 12 and a p-doped first emitter region 11, a suitable gate potential for effecting a conducting channel is a positive potential relative to the source potential, and a suitable gate potential for switching off the channel is a negative potential or zero relative to the source potential.

When the IGBT switches from its on-state into its off-state there is a reverse recovery process in which the charge carriers, in particular the minority charge carriers are removed from the base region 13. Minority charge carriers are holes in an n-doped base region 13 or are electrons in a p-doped base region 13. The removal of the stored charge carriers causes a reverse current, which is a current in the opposite direction as the current which flows when the IGBT is in its on-state. This reverse current in combination with a space charge region which starts to propagate in the base region 13 from the p-n junction between the body region 41 and the base region 13 may cause a local increase of the electric field strength in the base region 13 up to a critical value ($E_{CRIT}$) at which dynamic avalanche may occur. An avalanche breakdown causes a high current flow. This high current flow may damage the component, especially in those cases in which the avalanche breakdown and the associated current flow only occurs in a small area of the base region 13. A current flow limited to a small area of the base region 13 is also known as a current filament.

In order to prevent or at least reduce the risk of the appearance of such current filaments, the semiconductor component of FIG. 1 includes a plurality of higher doped regions 14 of the same conductivity type as the base region 13. These higher doped regions 14 serve to protect the semiconductor component against the appearance of current filaments and therefore are also referred to herein as filament protection regions or, briefly, protection regions 14. The protection regions 14 are spaced apart from each other in the lateral direction of the semiconductor body 100 and are spaced apart from or adjacent the second emitter region 12 and the body region 41. The doping concentration of the protection regions 14 is, for example, selected such that it is between 1.11 times and 100 times the doping concentration of the base region 13. In other words: The doping concentration of the base region 13 is between 1% and 90% of the doping concentration of the higher doped protection regions 14. According to a further embodiment, the doping concentration of the base region 13 is between 1% and 50% of the doping concentration of the protection regions 14, or between 1% and 10% of the doping concentration of the protection regions 14. The operating principle of the semiconductor component with the protections regions 14 will now be explained.

When the IGBT switches from its on-state into its off-state the charge carrier plasma is first removed from the lower doped base region 13 while the charge carrier plasma remains present in the higher doped protection regions 14, resulting in a higher charge carrier density in the protection regions 14 compared with the base region 13. The high charge carrier density in the protection regions 14 in connection with the high electric field strength may cause a dynamic avalanche in the protection regions 14 instead of the lower doped base region 13. If an avalanche breakdown occurs, this avalanche breakdown occurs in several protection regions 14, so that the appearance of a single current filament can be prevented during reverse recovery and, instead, the current is divided into multiple current channels at positions defined by the protection regions 14.

According to one embodiment, a distance d1 between the protection regions 14 and the body region 41 is, for example, in the range of between 0 μm and 20 μm.

According to a further embodiment, the distance d1 between the protection regions 14 and the body region 41 is in the range of between 0% and 50% of the length (thickness) l1 of the base region 13, or is in the range of between 15% or 20% of the length l1 of the base region 13. The length l1 of the base region 13 is the distance between the first emitter region 11 and the body region 41 in the current flow direction, i.e. in the vertical direction of the semiconductor body 100.

According to one embodiment, a distance between the protection regions 14 and the second emitter region 12 is between 2 μm and 22 μm. According to another embodiment, the distance between the protection regions 14 and the second emitter region 12 is between 2% and 22% of the length l1 of the base region 13. A distance between the protection regions 14 and the first emitter region 11 is, for example, in the range of between 0 and 90% of the length l1 of the base region 13.

A lateral distance d2 between two neighbouring protection regions 14 is at least 20 μm according to one embodiment. According to another embodiment, the distance d2 is between 20% and 100% of the length l1 of the base region 13, in particular between 30% and 80% of the length l1 of the base region 13. A width w of the protection regions 14 is, for example, in the range of between 20 μm and several 100 μm, like 500 μm. In this connection, the width is the smallest dimension of the protection regions 14 in the horizontal (lateral) direction of the semiconductor body 100. A horizontal length of the protection regions 14 can be much larger than the width, e.g. when the protection regions 14 are stripe-shaped.

Figure 5:
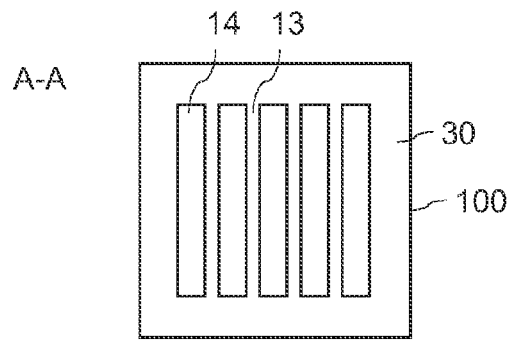
FIG. 5 illustrates a schematic horizontal cross sectional view of a bipolar transistor component including stripe-shaped higher doped regions in a base region according to an embodiment.
Figure 6:
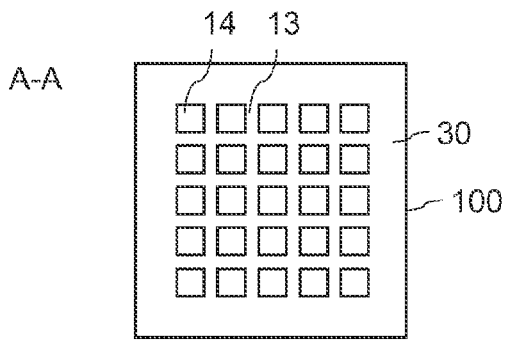
FIG. 6 illustrates a schematic horizontal cross sectional view of a bipolar transistor component including rectangular higher doped regions in a base region according to an embodiment.
Figure 7:
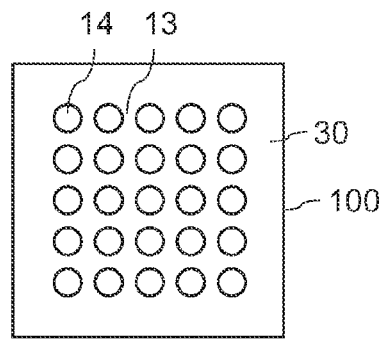
FIG. 7 illustrates a schematic horizontal cross sectional view of a bipolar transistor component including circular higher doped regions in a base region according to an embodiment.
Figure 8:
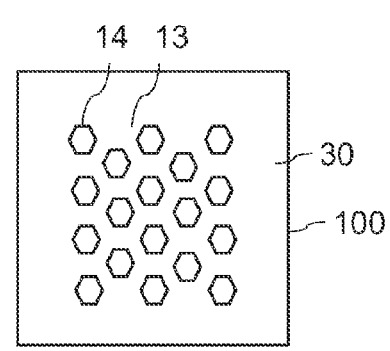
FIG. 8 illustrates a schematic horizontal cross sectional view of a bipolar transistor component including hexagonal higher doped regions in a base region according to an embodiment.

In the horizontal plane, the protection regions 14 may have one of a plurality of different shapes or geometries. Some exemplary embodiments are explained next with reference to FIGS. 5 to 8 each of which shows a horizontal cross sectional view of the semiconductor component in a section plane A-A illustrated in FIG. 1. Referring to FIG. 5, the protection regions 14 may have a stripe-shaped or longitudinal geometry. Referring to FIG. 6, the protection regions 14 may have a rectangular geometry, e.g. a square geometry. Referring to FIG. 7, the protection regions 14 may have an elliptical geometry, e.g. a circular geometry. Referring to FIG. 8 the protection regions 14 may have a polygonal geometry, e.g. a hexagonal geometry (as illustrated in FIG. 8) or an octagonal geometry. Of course, it is also possible to implement the protection regions 14 with different geometries and/or different sizes in one semiconductor component.

A length l2 of the protection regions 14 is, for example, in the range of between 5% and 100%, in the range of between 20% and 80%, in particular between 30% and 75% of the length l1 of the base region 13. In the embodiment illustrated in FIG. 1, the protection regions 14 have a relatively small length l2 as compared to the base region 13. In this embodiment the length l2 of the protection regions 14 is about 20% of the length l1 of the base region 13. When the length l2 of the protection regions 14 is 100% of the width of the base region 13, the protection regions 14 reach from the body regions 41 to the first emitter region 11. According to one embodiment, an absolute length of the protection regions 14 is above 5 μm or even above 30 μm.

An aspect ratio of the protection regions 14, which is a ratio between the length l2 and the width w of the protection regions 14, is between 0.1:1 and 50:1 according a first embodiment, between 0.5:1 and 25:1 according to a second embodiment, and between 2:1 and 50:1 according to a further embodiment.

Figure 9:
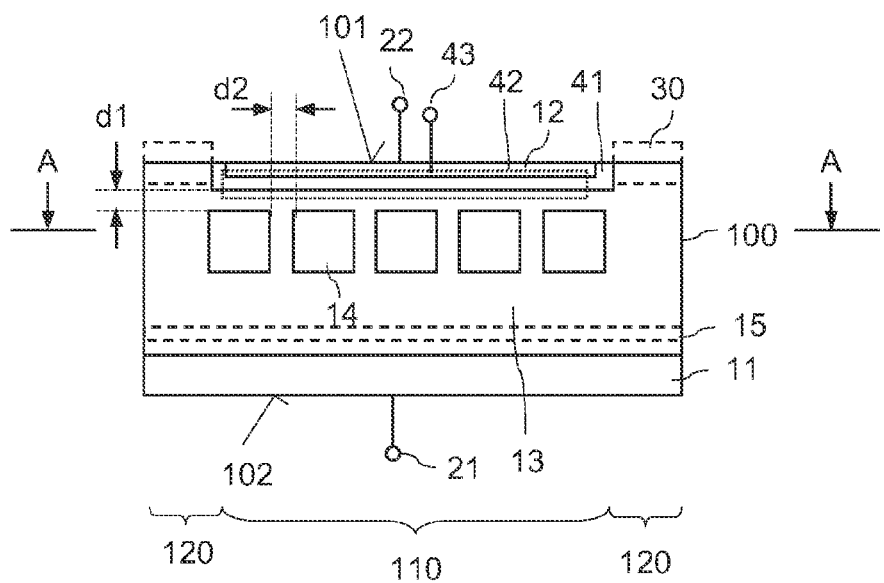
FIG. 9 shows a schematic vertical cross sectional view of an IGBT according to a second embodiment.
Figure 10:
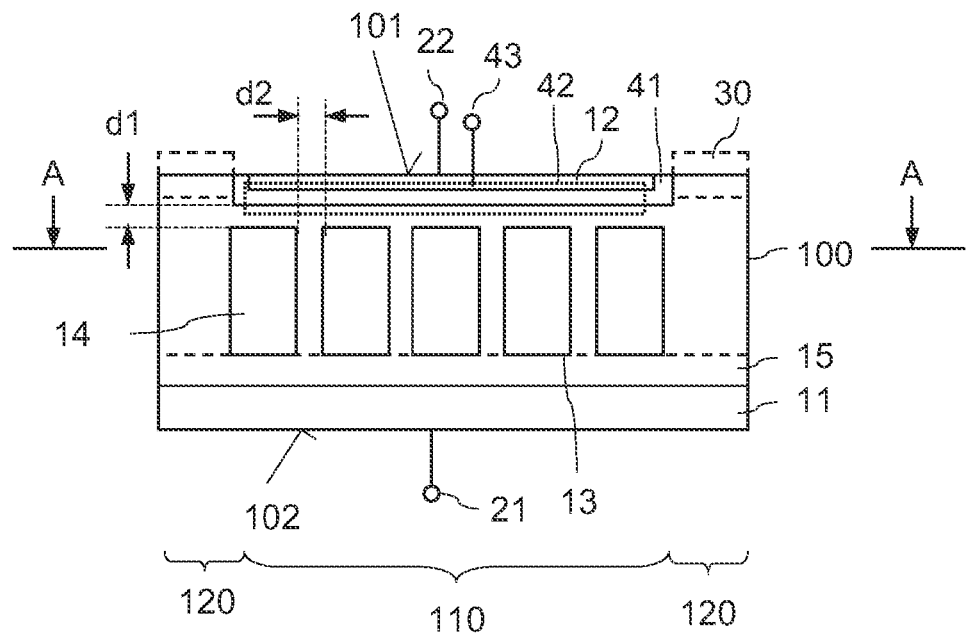
FIG. 10 shows a schematic vertical cross sectional view of an IGBT according to a third embodiment.

FIG. 9 illustrates a further embodiment of a power semiconductor component implemented as an IGBT. The component illustrated in FIG. 9 is a modification of the component illustrated in FIG. 1. In the semiconductor component of FIG. 9, the length l2 of the protection regions 14 is about 50% of the length l1 of the base region 13. FIG. 10 illustrates a further embodiment in which the length l2 of the protection regions 14 is about 75% of the length l1 of the base region 13. Further, in the embodiment of FIG. 10, the protection regions 14 extend to the field-stop region 15, which is arranged in the base region 13. In this embodiment, the field-stop region 15 in the vertical direction of the semiconductor body 100 adjoins the first emitter region 11. However, this is only an example. In the embodiments illustrated in FIGS. 1 and 8, the field-stop region 15 could also be arranged spaced apart from the first emitter region 11.

That which has been described in connection with the embodiment of FIG. 1 concerning dopant types, doping concentrations, distances, etc. also applies to the semiconductor components of FIGS. 9 and 10 accordingly.

The use of the protection regions 14 previously described herein with reference to FIGS. 1 to 10 is, of course, not restricted to IGBTs. The protection regions 14 can be implemented in each type of bipolar power semiconductor devices, such as power diodes, power IGBTs or power thyristors, in particular power GTOs (gate turn-off thyristors).

Figure 11:
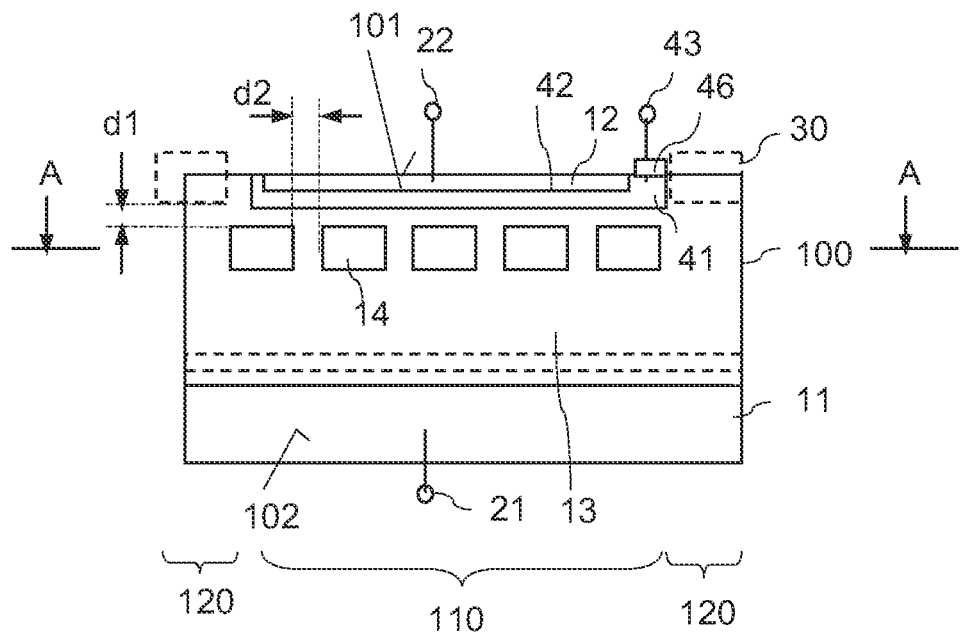
FIG. 11 illustrates a schematic vertical cross sectional view of a bipolar transistor component implemented as a thyristor according to an embodiment.

FIG. 11 shows a vertical cross sectional view of a power semiconductor component implemented as a GTO. The GTO illustrated in FIG. 11 is a vertical GTO which has a similar basic structure as the vertical IGBT illustrated in FIGS. 1, 9 and 10 with the difference that in the GTO the second emitter region 12 is separated from the base region 13 by a further base region 41 (which is similar to the body region in the IGBT so that the same reference character is used) of the first conductivity type, which is complementary to the conductivity type of the second emitter region 12 and the base region 13. A gate terminal 43, which is only schematically illustrated in FIG. 11 is connected to the second base region 41 through a contact electrode 46. The reverse recovery mechanism in a GTO is the same as in a diode so that further explanation is not required in this regard.

Figure 12:
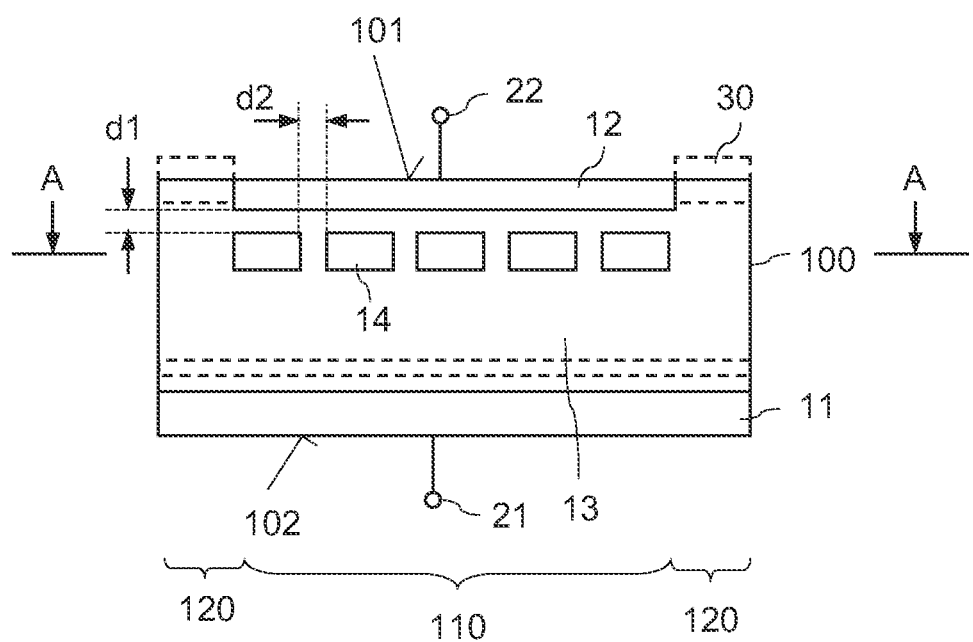
FIG. 12 illustrates a schematic vertical cross sectional view of a bipolar transistor component implemented as a diode according to an embodiment.

FIG. 12 shows a vertical cross sectional view of a power semiconductor component implemented as a diode. In this diode, the first emitter region 11 and the base region 13 have the same conductivity type, which is the first conductivity type. The base region 13 is lower doped than the protection region 14. The second emitter region 12 is doped complementary to the base region 13 and the first emitter region 11, so that a p-n junction is formed between the second emitter region 12 and the base region 13. According to one embodiment, the first conductivity type of the first emitter region 11 and the base region 13 is n-type, while the second conductivity type of the second emitter region 12 is p-type. The absolute doping concentrations of the first and second emitter regions 11, 12 and of the base region 13 may correspond to the doping concentrations of the corresponding regions in the IGBT e.g. as previously described herein. That which has been described previously herein concerning the geometry, positioning within the base region 13, and doping concentration of the protection region 14 in an IGBT applies to the protection regions in the diode of FIG. 12 accordingly.

The difference between the diode and the IGBT is that the on-state and off-state of the diode can only be controlled by the polarity of the voltage applied between the first and second terminals 21, 22, while an IGBT can be switched on and off by applying a suitable potential to the gate terminal 43. The diode is in its on-state when this voltage is a voltage which biases a p-n junction between the base region 13 and the second emitter region 12 in a forward direction, and is in its off-state when this voltage biases the p-n junction in the reverse direction.

Spatially relative terms such as "under", "below", "lower", "over", "upper" and the like, are used for ease of description to explain the positioning of one element relative to a second element. These terms are intended to encompass different orientations of the device in addition to different orientations than those depicted in the figures. Further, terms such as "first", "second", and the like, are also used to describe various elements, regions, sections, etc. and are also not intended to be limiting. Like terms refer to like elements throughout the description.

As used herein, the terms "having", "containing", "including", "comprising" and the like are open ended terms that indicate the presence of stated elements or features, but do not preclude additional elements or features. The articles "a", "an" and "the" are intended to include the plural as well as the singular, unless the context clearly indicates otherwise.

With the above range of variations and applications in mind, it should be understood that the present invention is not limited by the foregoing description, nor is it limited by the accompanying drawings. Instead, the present invention is limited only by the following claims and their legal equivalents.

What is claimed is:

1. A semiconductor component, comprising:
a semiconductor body;
a first emitter region of a first conductivity type in the semiconductor body;
a second emitter region of a second conductivity type spaced apart from the first emitter region in a vertical direction of the semiconductor body;
a base region of one of the first and second conductivity types arranged between the first emitter region and the second emitter region;
at least two higher doped regions of the same conductivity type as the base region and arranged in the base region; and
wherein the at least two higher doped regions are spaced apart from one another in a lateral direction of the semiconductor body, spaced apart from the first emitter region and the second emitter region, and separated from one another only by sections of the base region;
wherein sections of the base region are located between the at least two higher doped regions and the first emitter region; and
wherein a doping concentration is substantially homogenous in the sections of the base region that separate the at least two higher doped regions from one another in the lateral direction.

2. The semiconductor component of claim 1, wherein a doping concentration of the base region is between 1% and 90% of the doping concentration of the at least two higher doped regions.

3. The semiconductor component of claim 2, wherein the doping concentration of the base region is between 1% and 50% of the doping concentration of the at least two higher doped regions.

4. The semiconductor component of claim 3, wherein the doping concentration of the base region is between 1% and 10% of the doping concentration of the at least two higher doped regions.

5. The semiconductor component of claim 1, wherein the base region has a length in the vertical direction of the semiconductor body, and wherein a vertical distance between the first emitter region and the at least two higher doped regions is less than or equal to 99% of the length of the base region.

6. The semiconductor component of claim 5, wherein the vertical distance between the first emitter region and the at least two higher doped regions is between 10% and 99% of the length of the base region.

7. The semiconductor component of claim 1, wherein the base region has a length in the vertical direction of the semiconductor body, and wherein a lateral distance between two neighbouring ones of the at least two higher doped regions is between 10% and 100% of the length of the base region.

8. The semiconductor component of claim 7, wherein the lateral distance between the two neighbouring higher doped regions is between 50% and 80% of the length of the base region.

9. The semiconductor component of claim 1, wherein the at least two higher doped regions have one of a rectangular, circular, hexagonal, or octagonal shape in a horizontal plane of the semiconductor body.

10. The semiconductor component of claim 1, wherein the semiconductor component is a diode.

11. The semiconductor component of claim 10, wherein a distance between the at least two higher doped regions and the second emitter region is between 0 µm and 30 µm or between 0% and 30% of a length of the base region in the vertical direction.

12. The semiconductor component of claim 1, wherein the semiconductor component is an IGBT and further comprises:
   a body region of the first conductivity type arranged between the first emitter region and the base region; and
   a gate electrode arranged adjacent the body region and dielectrically insulated from the body region by a gate dielectric.

13. The semiconductor component of claim 12, wherein the at least two higher doped regions are arranged adjacent or spaced apart from the body region in the vertical direction of the semiconductor body.

14. The semiconductor component of claim 13, wherein the base region has a length in the vertical direction of the semiconductor body, and wherein a distance between the body region and the at least two higher doped regions is between 0% and 20% of the length of the base region.

15. The semiconductor component of claim 14, wherein the distance between the body region and the at least two higher doped regions is between 10% and 20% of the length of the base region.

16. The semiconductor component of claim 1, wherein the semiconductor component is a thyristor and further comprises:
   a further base region of the first conductivity type arranged between the second emitter region and the base region; and
   a gate electrode contacting the further base region.

17. The semiconductor component of claim 16, wherein the at least two higher doped regions are arranged adjacent or spaced apart from the second base region in the vertical direction of the semiconductor body.

18. The semiconductor component of claim 16, wherein the base region has a length in the vertical direction of the semiconductor body, and wherein a distance between the second base region and the at least two higher doped regions is between 1% and 20% of the length of the base region.

19. The semiconductor component of claim 18, wherein the distance between the second base region and the at least two higher doped regions is between 10% and 20% of the length of the base region.

20. The semiconductor component of claim 1, wherein a length of the at least two higher doped regions in the vertical direction of the semiconductor body is larger than 5 µm or larger than 30 µm.

21. The semiconductor component of claim 1, wherein a length of the at least two higher doped regions in the vertical direction of the semiconductor body is between 5% and 100%, between 20% and 80%, or between 30% and 75% of a length of the base region.

22. The semiconductor component of claim 1, wherein a ratio between a length of the at least two higher doped regions in the vertical direction and a width of the at least two higher doped regions is between 0.1:100 and 50:1, between 0.5:1 and 25:1, or between 2:1 and 50:1.

23. A semiconductor component, comprising:
   a semiconductor body;
   a first emitter region of a first conductivity type in the semiconductor body;
   a second emitter region of a second conductivity type spaced apart from the first emitter region in a vertical direction of the semiconductor body;
   a base region of one conductivity type arranged between the first emitter region and the second emitter region;
   at least two higher doped regions of the same conductivity type as the base region and arranged in the base region;
   wherein the at least two higher doped regions are spaced apart from one another in a lateral direction of the semiconductor body and separated from one another only by sections of the base region;
   wherein the first emitter region adjoins the base region; and
   wherein a doping concentration is substantially homogenous in the sections of the base region that separate the at least two higher doped regions from one another in the lateral direction.

24. The semiconductor component of claim 1, wherein the at least two higher doped regions are disconnected from the first and second emitter regions.

25. The semiconductor component of claim 1, wherein the semiconductor component is one of the following: an insulated gate bipolar transistor, a diode or a thyristor.

* * * * *